United States Patent
Iimura et al.

(10) Patent No.: US 6,593,169 B2
(45) Date of Patent: Jul. 15, 2003

(54) METHOD OF MAKING HYBRID INTEGRATED CIRCUIT DEVICE

(75) Inventors: Junichi Iimura, Gunma (JP); Katsumi Okawa, Gunma (JP); Yasuhiro Koike, Gunma (JP); Hidefumi Saito, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/183,757

(22) Filed: Jun. 27, 2002

(65) Prior Publication Data

US 2003/0003630 A1 Jan. 2, 2003

(30) Foreign Application Priority Data

Jun. 28, 2001 (JP) ........................................ 2001-196987

(51) Int. Cl.[7] .............................................. H01L 21/00
(52) U.S. Cl. ........................ 438/112; 438/124; 438/127
(58) Field of Search .................... 438/107, 111, 438/112, 124, 126, 127

(56) References Cited

U.S. PATENT DOCUMENTS

| | | | | |
|---|---|---|---|---|
| 5,096,852 A | * | 3/1992 | Hobson | 438/107 |
| 5,918,112 A | * | 6/1999 | Shah et al. | 438/124 |
| 6,133,070 A | * | 10/2000 | Yagi et al. | 438/111 |
| 6,291,274 B1 | * | 9/2001 | Oida et al. | 438/124 |
| 6,321,734 B1 | * | 11/2001 | Kaminaga et al. | 438/127 |
| 2001/0020736 A1 | * | 9/2001 | Nakazawa et al. | 438/121 |

* cited by examiner

*Primary Examiner*—Chandra Chaudhari
(74) *Attorney, Agent, or Firm*—Fish & Richardson P.C.

(57) ABSTRACT

In a molding process, a hybrid integrated circuit substrate is positionally fixed in a horizontal direction. By abutting the points, where particularly leads having a spacing kept constant continue with a first connection portion, against guide pins provided on a mold die, a hybrid integrated circuit substrate can be positionally fixed. Because the spacing between the particular leads is not relied upon the number of terminals of the hybrid integrated circuit substrate, the mold can be commonly used where the number of terminals is different.

9 Claims, 12 Drawing Sheets

METHOD OF MAKING HYBRID INTEGRATED CIRCUIT DEVICE

BACKGROUND OF THE INVENTION

The present invention relates to a manufacturing method of, and more particularly to a manufacturing method of hybrid integrated circuit device having a resin seal body formed on a hybrid integrated circuit substrate by transfer molding.

Generally, there are, principally, two methods of sealing employed for hybrid integrated circuit devices.

The first method employs member having such a form as placing a lid, generally called a case member, on a hybrid integrated circuit substrate mounted with circuit elements of semiconductor chips or the like. This structure includes a hollow structure or that having a resin separately filled therein.

The second method is injection molding as a process to mold semiconductor ICs. This is described, e.g. in Japanese Patent Publication No. H11-330317. The injection molding generally uses thermoplastic resin. For example, the resin heated at 300° C. is injected under a high injection pressure and poured into a mold at one time, whereby the resin is molded. Since a resin polymerization time is not required after pouring a resin into a mold, there is a merit to shorten the operation time as compared with transfer molding.

Explanation will be made on a method of manufacturing a conventional hybrid integrated circuit device using injection molding, with reference to FIGS. 9 to 12C.

First, an aluminum (hereinafter, referred to as Al) substrate 1 is employed as a metal substrate as shown in FIG. 9, in order for explanation.

The Al substrate 1 is anodized in its surface. Furthermore, a resin 2 having an excellent insulation property is formed on the entire surface of the anodized Al substrate 1. However, the oxide may be omitted where voltage resistance is not taken into consideration.

As shown in FIGS. 12B and 12C, a resin seal body 10 is formed by a support member 10a and a thermoplastic resin. Namely, a substrate 1 mounted on the support member 10a is covered with thermoplastic resin by injection molding. The support member 10a and the thermoplastic resin have an abutment region. The abutment region of support member 10a is fused by the poured hot thermoplastic resin, thereby realizing a full-mold structure as shown in FIG. 10.

Herein, the thermoplastic resin adopted is a resin called PPS (polyphenyl sulfide).

The injection temperature of thermoplastic resin is as high as 300° C. Consequently, there is a problem that solder 12 be fused by the hot resin thereby causing poor soldering. For this reason, an overcoat 9 is formed by potting a thermosetting resin (e.g. epoxy resin) in a manner previously covering solder joints, metal fine wires 7, active elements 5 and passive elements 6. Due to this, the fine wires (approximately 30–80 μm) particularly are prevented from being fallen down and broken under an injection resin pressure during forming with a thermoplastic resin.

The resin seal body 10 is formed through two stages shown in FIGS. 12B and 12C. In the first stage, a gap is provided at between a backside of the substrate 1 and a mold die. The support member 10a is placed on the backside of the substrate, in consideration of securing a thickness at a backside of the substrate 1 upon poring a resin under a high pressure into the gap. In the second stage, the substrate 1 mounted on the support member 10a is covered with a thermoplastic resin by injection molding. In the abutment region between the support member 10a and the thermoplastic resin, the abutment region of the support member 10a is fused by the poured hot thermoplastic resin thereby realizing a full-mold structure. Herein, the thermoplastic resin on the support member 10a preferably has an equivalent thermal expansion to that of the substrate 1.

Next, explanation will be made on a conventional method of manufacturing a hybrid integrated circuit device using injection molding, with reference to FIGS. 10 to 12C.

FIG. 10 is a flowchart, including a metal substrate preparing process, an insulating layer forming process, a Cu foil pressure-laying process, a partial Ni plating process, a Cu foil etching process, a die bonding process, a wire bonding process, a potting process, a lead connection process, a support member attaching process, an injection mold process and a lead cutting process.

FIGS. 11A to 12C show the sectional views of the processes. Note that the processes, that are apparent without showing, are omittedly shown.

At first, FIGS. 11A and 11B show a metal substrate preparing process, an insulating layer forming process, a Cu foil pressure-laying process, a partial Ni plating process and a Cu foil etching process.

In the metal substrate preparing process, prepared is a substrate in consideration of its property of heat dissipation, substrate strength, substrate shield and the like. This example uses an Al substrate 1 having a thickness, e.g. of approximately 1.5 mm, excellent in heat dissipation property.

Next, a resin 2 excellent in insulation property is further formed over the entire surface of the aluminum substrate 1. On the insulating resin 2, a Cu conductor foil 3 is pressure-laid to constitute a hybrid integrated circuit. On the Cu foil 3, an Ni plating 4 is provided over the entire surface in consideration of adhesion to a metal fine wire 7 electrically connecting between the Cu foil 3 as a lead-out electrode and an active element 5.

Thereafter, a known screen-printing is used to form Ni plating 4a and a conductive path 3a.

Next, FIG. 11C shows a die bonding process and a wire bonding process.

On the conductive path 3a formed in the preceding process, an active element 5 and a passive element 6 are mounted through a conductive paste such as a solder paste 12, thereby realizing a predetermined circuit.

Next, FIGS. 12A and 12B show a potting process, a lead connection process and a support member attaching process.

As shown in FIG. 12A, in the potting process, prior to a later injection mold process, potting is previously made with a thermosetting resin (e.g. epoxy resin) onto the solder junctions, metal fine wires 7, active elements 5 and passive elements 6, thereby forming an overcoat 9.

Next, prepared is an outer lead 8 for outputting and inputting signals from and to the hybrid integrated circuit. Thereafter, the outer lead 8 is connected to the external connection terminal 11 formed in a peripheral area of the substrate 1 through a solder 12.

Next, as shown in FIG. 12B, the hybrid integrated circuit substrate 1 connected with the outer lead 8 and the like is mounted on a support member 10a. By mounting the substrate 1 on the support member 10a, it is possible to secure a thickness of a resin seal body at a backside of the substrate 1 during injection molding as explained in the next process.

Next, FIG. 12C shows an injection mold process and a lead cutting process.

As shown in the figure, after potting is done with a thermosetting resin on the substrate 1 to form a overcoat 9, a resin seal body 10 is formed by injection molding. At this time, in the abutment region between the support member 10a and the thermoplastic resin, the abutment region of the support member 10a is fused by the injected hot thermoplastic resin and turned into a full-mold structured resin seal body 10.

Finally, the outer lead 8 is cut to a use purpose thereby adjusting the length of the outer lead 8.

By the above process, a hybrid integrated circuit device is completed as shown in FIG. 9.

On the other hand, in the semiconductor industry, it is a general practice to carry out a transfer mold process. In a hybrid integrated circuit device by the conventional transfer molding, a semiconductor chip is fixed on a leadframe, e.g. of Cu. The semiconductor chip and the lead are electrically connected through a gold wire (hereinafter, referred to as Au). This is because the impossibility of employing an Al fine wire in respect of ready bendability and time-consumed bonding requiring ultrasonic waves. Consequently, there has not conventionally existed a hybrid integrated circuit device that is formed by one metal plate to have a circuit formed thereon and further the metal substrate wire-bonded by Al fine wires is directly transfer-molded.

In a hybrid integrated circuit device of an injection mold type, there has been a need to prevent the metal fine wire 7 from being bent or broken under an injection pressure during molding, and the solder 12 from flowing at a temperature upon injection molding. For this reason, in the conventional structure shown in FIG. 9, the overcoat 9 due to potting has been adopted in order to cope with the foregoing problem.

However, because injection molding is carried out after potting a thermosetting resin (e.g. epoxy resin) to form an overcoat 9, there is a problem of consuming a material cost for thermosetting resin together with operation cost.

Meanwhile, in the hybrid integrated circuit device by the conventional transfer molding using a leadframe, a semiconductor chip or the like is fixed on an island. Accordingly, although the heat generated from the semiconductor chip or the like dissipates at the fixing region, there is a problem that there is a limitation in heat dissipating area resulting in poor heat dissipation.

Furthermore, because the wire bonding within the resin seal body uses Au wires resistive to resin injection pressure as noted above, it is not a current practice to carry out transfer molding with using Al fine wires. The Al fine wire is readily bent due to the causes of a weak neck resulting from ultrasonic bonding and further too low elastic modulus to withstand under injection pressure.

Furthermore, in the case of integrally molding hybrid integrated circuit substrates by transfer molding, it is necessary to fix a position of the hybrid integrated circuit substrate in horizontal and thickness directions within the mold cavity. However, there is a problem that, in case a fixing pin is abutted against a back surface of the hybrid integrated circuit substrate to thereby carry out positioning, the substrate after packaging is exposed at its back surface thus incurring the deterioration in dielectric strength.

Therefore, a problem to be solved by the present invention is to fix a hybrid integrated circuit substrate in a predetermined position within a mold in a transfer mold process.

SUMMARY OF THE INVENTION

In order to solve the foregoing problem, a method of manufacturing a semiconductor circuit device comprising: a step of preparing a hybrid integrated circuit substrate insulation-treated al least in a surface thereof; a step of forming a conductor pattern on the substrate; a step of mounting a semiconductor or passive element on the conductor pattern; a step of electrically connecting a lead to the substrate; and a step of molding a thermosetting resin to at least a surface of the substrate by transfer molding.

Meanwhile, the invention is characterized in that, in a step of molding, a spacing between particular leads of the leadframe soldered on the hybrid integrated substrate is given constant so that the particular leads can be abutted at portions continuing to the connection portion provided at lead end against guide pins provided on the mold die. This makes it possible to positionally fix the leadframe and further the hybrid integrated circuit substrate, thus solving the conventionally encountered problem. Furthermore, by positionally fixing the hybrid integrated circuit substrate, the hybrid integrated circuit substrate can be covered, at its back surface, with using a resin having high heat dissipation property, thus improving the heat dissipation property for the hybrid integrated circuit device.

DETAILED DESCRIPTION OF THE PREFERRED EMBODIMENT

Explanation will be now made on a hybrid integrated circuit device according to a first embodiment of the invention with reference to FIGS. 1A to 2B.

Figure 2A:
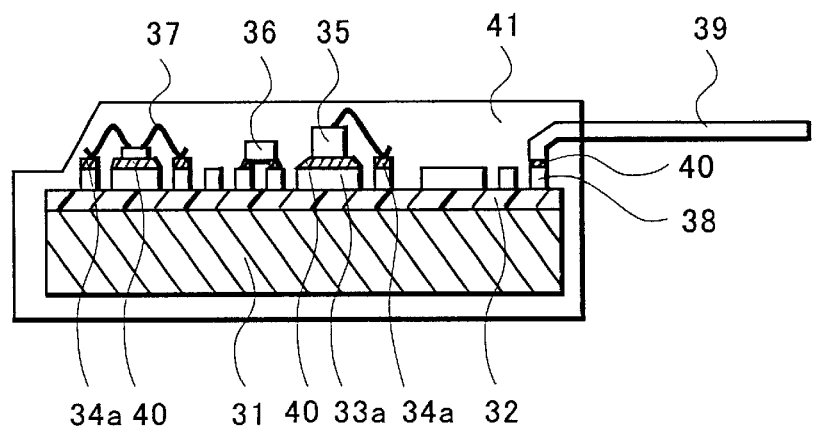
FIG. 2A is a sectional view of the hybrid integrated circuit device of the invention.
Figure 2B:
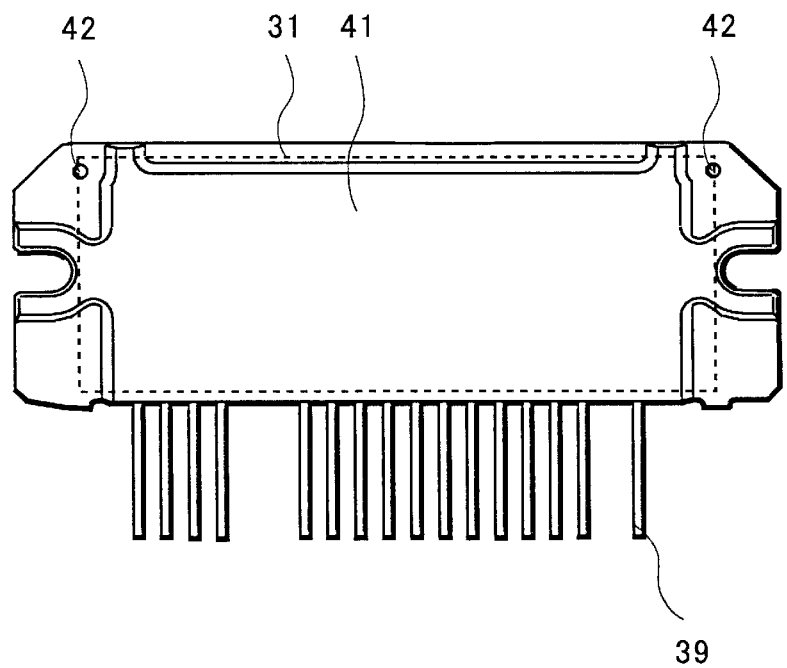
FIG. 2B is a plan view thereof.

Referring to FIGS. 2A and 2B, a structure of the hybrid integrated circuit device will be first explained. As shown in FIG. 2A, a hybrid integrated circuit substrate 31 employs a substrate excellent in heat dissipation property in consideration of the heat generation of from the semiconductor chips fixed on the substrate 31. This embodiment explains a case using an aluminum substrate 31. Note that, although the substrate 31 in the embodiment uses an aluminum (hereinafter, referred to as Al) substrate, this is not necessarily limited to. For example, the embodiment is to be realized in case the substrate 31 uses a printed substrate, a ceramic substrate, a metal substrate or the like. The metal substrate may use a Cu substrate, an Fe substrate, an Fe—Ni substrate, an AlN (aluminum nitride) substrate or the like.

The Al substrate 31 is anodized in its surface, to further form an insulating resin 32 excellent in insulation, e.g. epoxy resin, over the entire surface thereof. Note that this metal oxide may be omitted without problem where voltage resistance is not considered.

On the resin 32, a conductive path 33a is formed by a Cu foil 33 (see FIG. 5). An epoxy resin, for example, is overcoated to protect the conductive path 33a on the Al substrate 31, in a position except for electrical connection points. On the conductive path 33a, an active element 35 such as a power transistor, small-signal transistor or IC, and a passive element 36 such as a chip resistor or chip capacitor, are mounted through a solder 40. Thus, a predetermined circuit is realized. Herein, by providing electrical connection using an Ag paste or the like, soldering may be partly omitted. In the case of mounting face up an active element 35, such as a semiconductor chip, connection is through a metal fine wire 37. For a power semiconductor chip, the metal fine wire 37 uses an Al wire having approximately 150–500 $\mu m\phi$, for example. This is generally called a thick wire. For a semi-power or small-signal semiconductor chip, used is an Al wire having approximately 30–80 $\mu m\phi$, for example. This is generally called a fine wire. An external connection terminal 38, in a peripheral area of the Al substrate 31, is connected with an outer lead 39 of Cu or Fe—Ni through a solder 40.

According to the present invention, a resin seal body is directly formed over active element 35, a passive element 36 and Al wires 37 and the like on the hybrid integrated circuit substrate 31.

Figure 9:
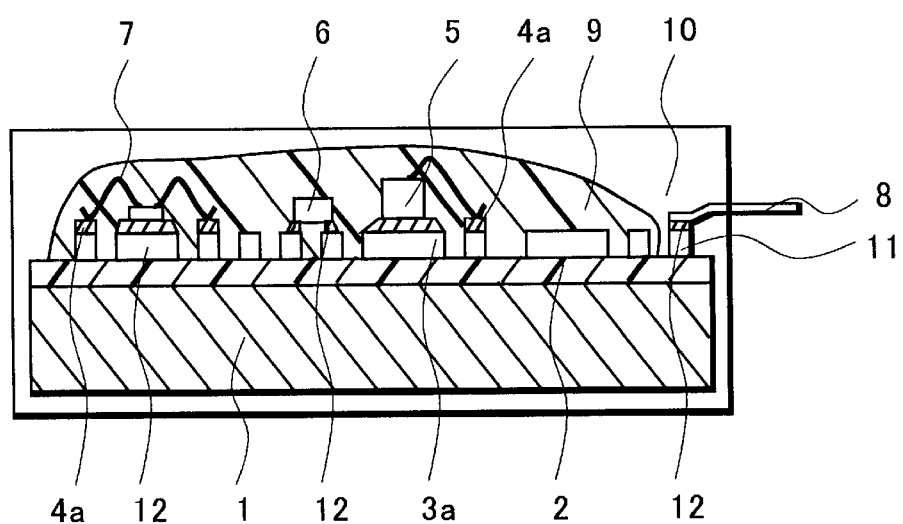
FIG. 9 is a sectional view of a conventional hybrid integrated circuit device.
Figure 10:
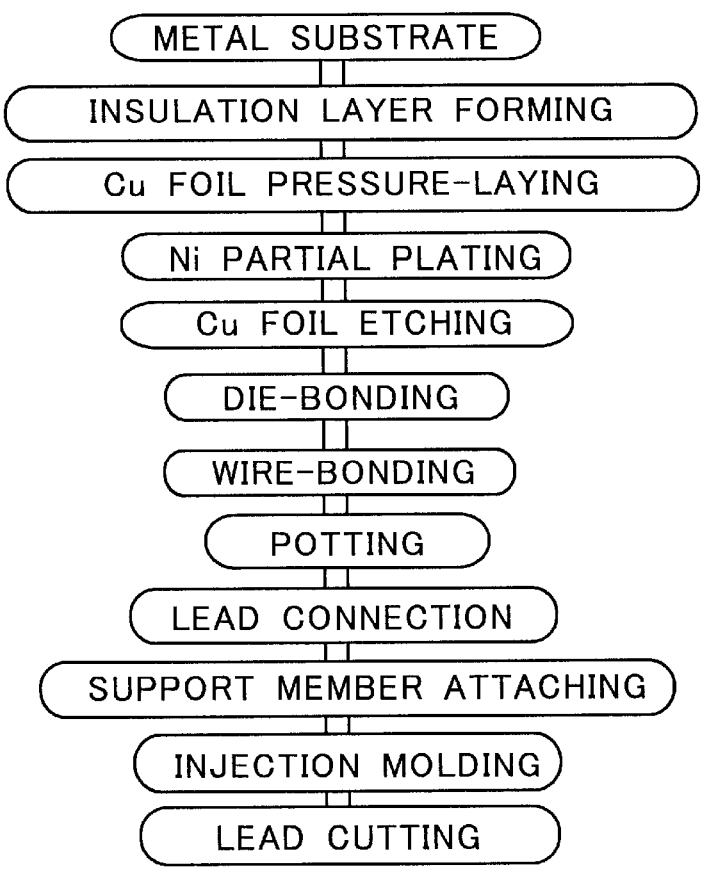
FIG. 10 is a flowchart of a conventional manufacturing method of a hybrid integrated circuit device.
Figure 11A:
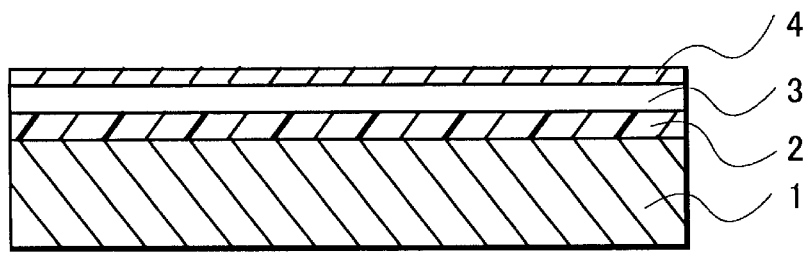
FIGS. 11A to 11C are views explaining the conventional manufacturing method of a hybrid integrated circuit device.
Figure 11B:
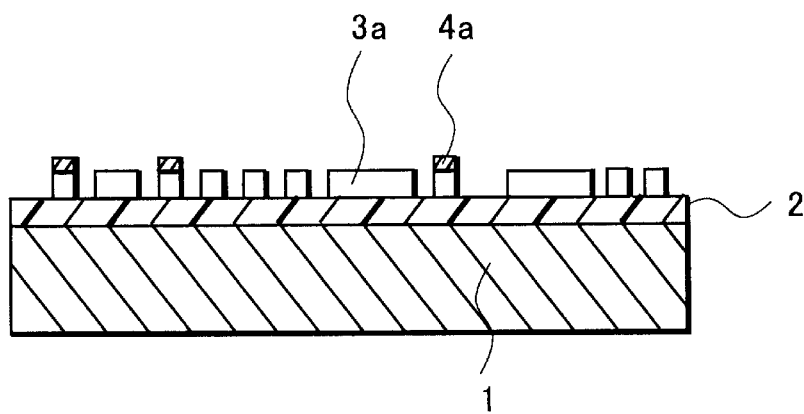
Figure 11C:
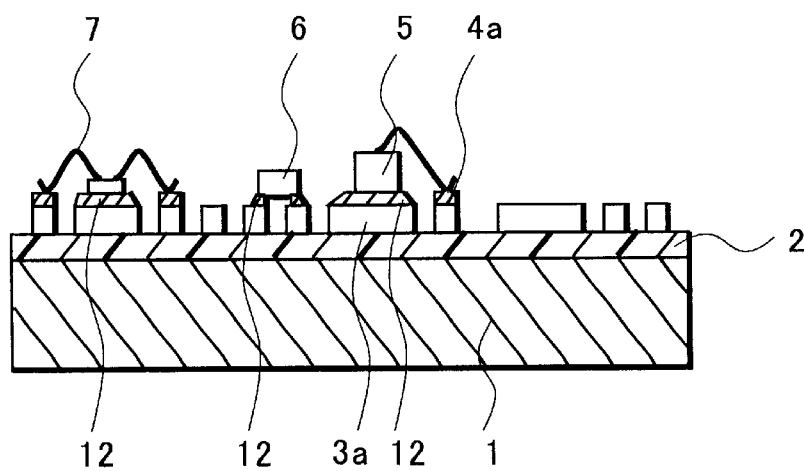
Figure 12A:
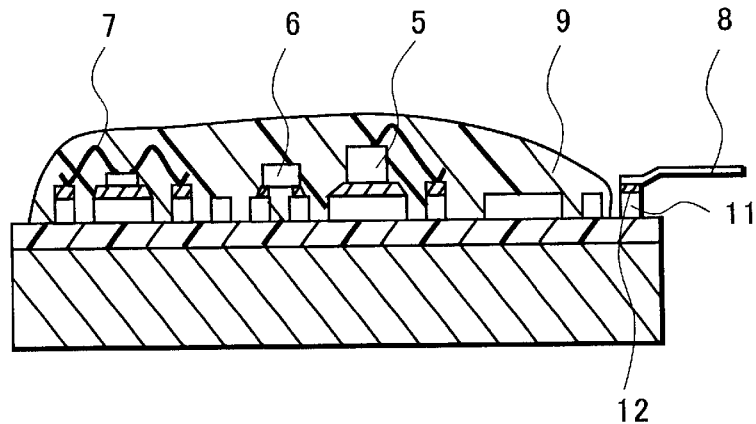
FIGS. 12A to 12C are views explaining the conventional manufacturing method of a hybrid integrated circuit device.
Figure 12B:
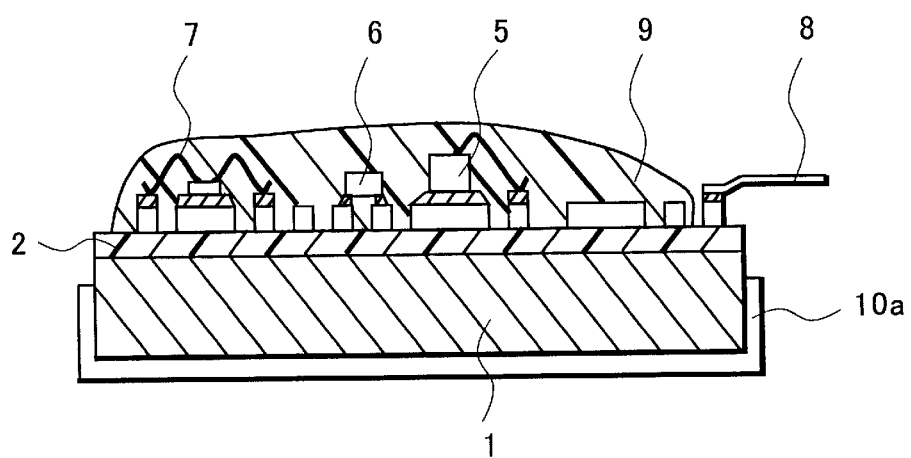
Figure 12C:
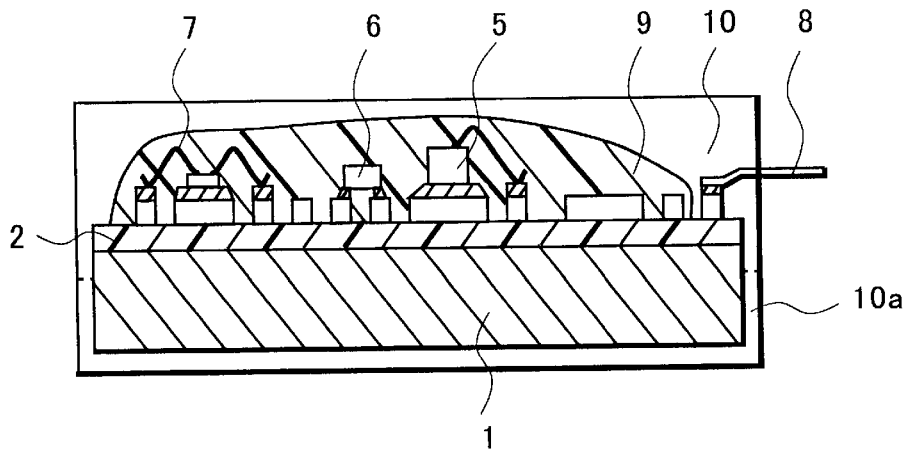

Namely, in the resin seal body 41, the thermosetting resin for use in transfer molding has a low viscosity and a cure temperature lower than a melting point of the solder 40 used in the connection member, e.g. 183° C. This can eliminate the overcoat 9 formed by potting a thermosetting resin (e.g. epoxy resin) required on the conventional hybrid integrated circuit device shown in FIG. 9.

As a result, in case thermosetting resin is poured directly over the metal fine wire having a diameter, e.g. of approximately 40 $\mu m$, electrically connecting the small-signal IC or the like to the conductive path 33a during transfer molding, there is no possibility of falling down, disconnection or bending. A feature of the present invention is that the Al fine wire is prevented from being bent during the molding process.

As shown in FIG. 2B, the outer leads 39 extend externally of the resin seal body 41. The outer leads 39 are adjusted in length in compliance with the purpose of use. Holes 42 are formed as traces of pushpins in the resin seal body 41, at two points close to a side opposite to a side the outer leads 39 extend. The holes 42 are caused by pushpins 47 (see FIG. 6) fixing the substrate 31 during transfer molding, which are left even after forming a resin seal body 41.

Figure 1A:
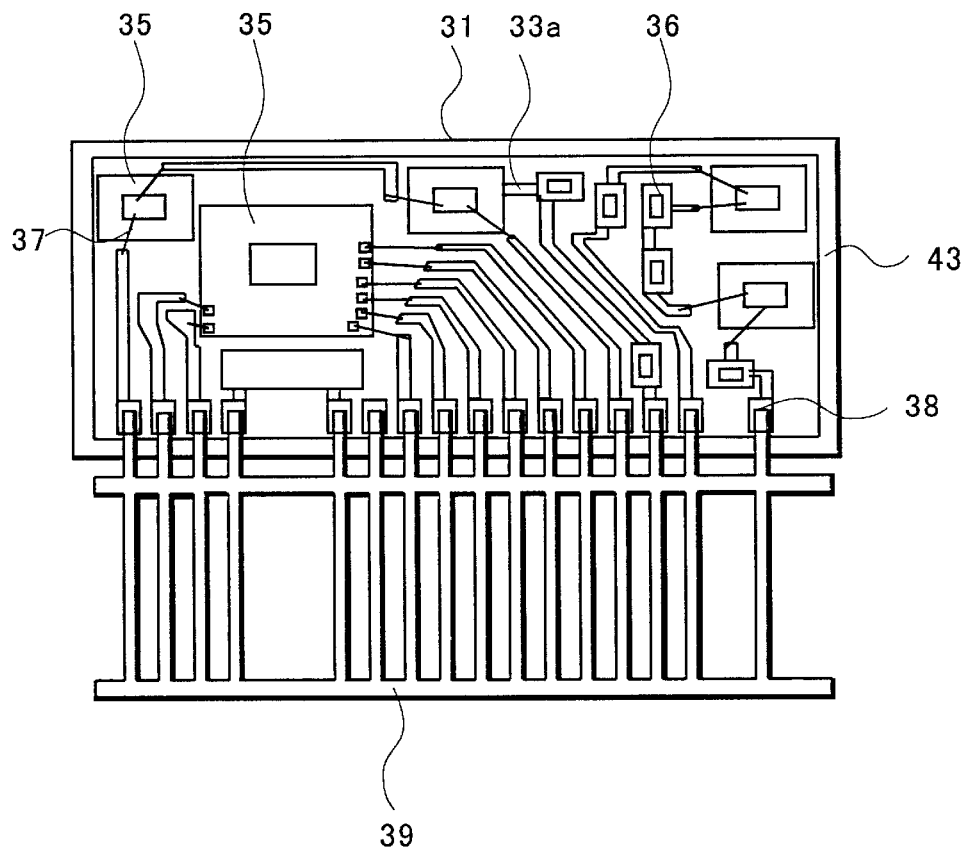
FIG. 1A is a plan view of a hybrid integrated circuit device of the present invention.

Referring to FIG. 1A, the holes 42 are formed in a peripheral region 43 of the substrate 31, i.e. in a region not formed with a circuit or the like on the substrate 31. Furthermore, because the holes 42 are formed in the peripheral region of the substrate 31 over the resin film 32, it is structurally free from problem in respect of quality and moisture resistance. Herein, the peripheral region 43 is a margin provided to secure a distance from a circuit area upon individually pressing the substrate 31.

Figure 1B:
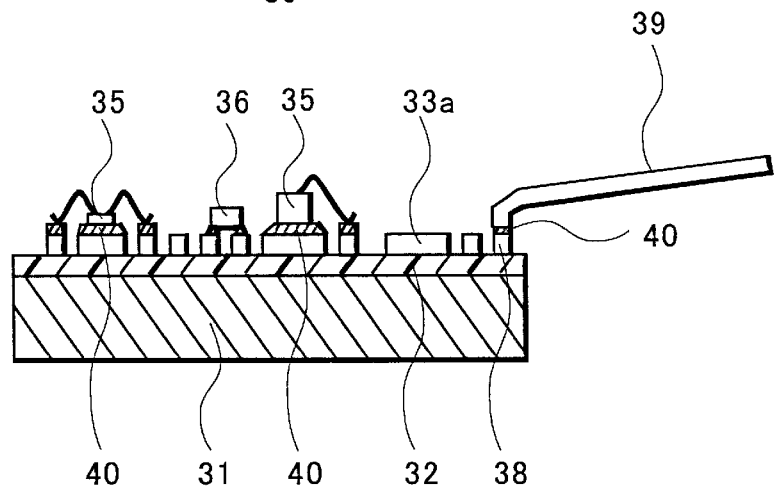
FIG. 1B is a sectional view thereof.

As shown in FIGS. 1A and 1B, a conductive paths 33a is densely formed on the Al substrate 31. On the conductive path 33a, mounted are an active element 35 such as a power transistor, small-signal transistor or IC, and a passive element 36 such as a chip resistance or capacitance through a solder 40 or the like. Meanwhile, outer leads 39 are connected through external connection terminals 38, thereby realizing a predetermined circuit.

As shown in the figure, a complicated circuit is formed within a narrow space on the substrate 31. According to the hybrid integrated circuit device of the invention, after forming an insulating resin 32 over the entire surface of the Al substrate 31, a complicated circuit is formed and thereafter outer leads 39 are bonded to the substrate 31, followed by integrally, directly forming a resin seal body 41 by transfer molding.

In the conventional, where forming a hybrid integrated circuit device by transfer molding, a leadframe of Cu, for example, is worked by etching, punching or pressing to form wiring, lands and the like. It has been impossible to form such a complicated circuit as a conductor pattern of a hybrid integrated circuit. Meanwhile, with a leadframe for transfer molding, when forming a wiring as in FIG. 1A, there is a need of fixing with suspension leads at various points in order to prevent against lead warpage. In this manner, a hybrid integrated circuit using a usual leadframe can mount several active parts at the utmost. Thus, there is a restriction in forming a hybrid integrated circuit having such a conductor pattern as that of FIG. 2A.

Namely, by providing a structure of hybrid integrated circuit device of the invention, a substrate 31 having a complicated circuit can be formed by transfer molding. Furthermore, because the invention uses a substrate having a high thermal conductivity to carry out transfer molding, the heat generated can be dissipated at the entire of the substrate 31. Accordingly, as compared to the hybrid integrated circuit device using the conventional leadframe, the metal substrate 31 directly molded acts as a large-sized heat-sink thus providing excellent heat dissipation and realizing circuit characteristic improvement.

Next, explanation will be made on a method of manufacturing a hybrid integrated circuit device of the invention with reference to FIGS. 3 to 8B. Note that, in FIGS. 4A to 9B, the processes, that are apparent without showing, are omitted in the figures.

Figure 3:
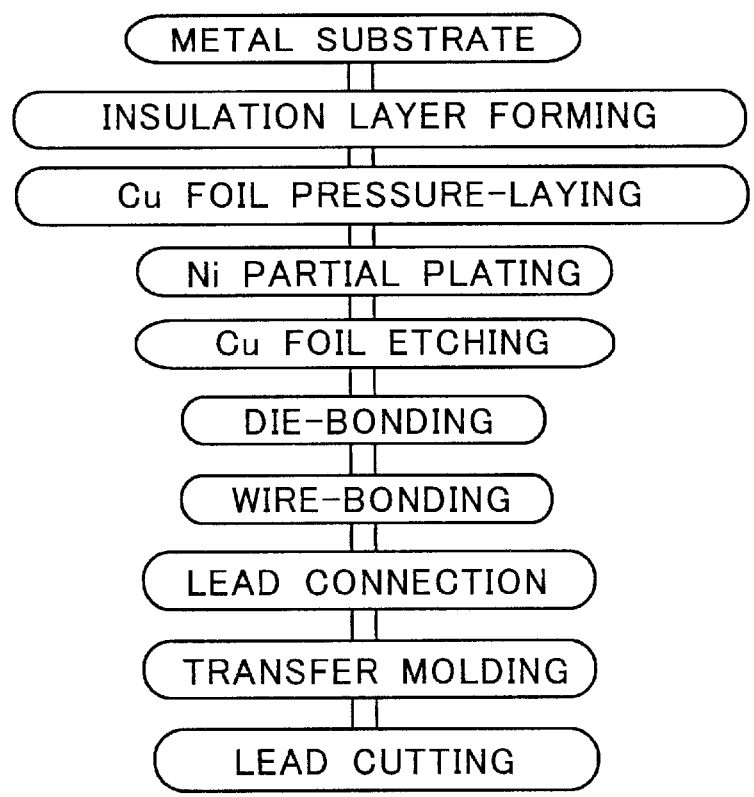
FIG. 3 is a flowchart of a manufacturing method of a hybrid integrated circuit device of the invention.

FIG. 3 is a process flowchart, including a metal substrate preparing process, an insulating layer forming process, a Cu foil pressure-laying process, an Ni partial plating process, a Cu foil etching process, a die bonding process, a wire bonding process, a lead connection process, a transfer mold process, and a lead cutting process. As apparent from the flow, it is a conventional practice to form a resin seal body by injection molding. The invention, however, has realized a process to form a resin seal body by transfer molding.

Figure 4A:
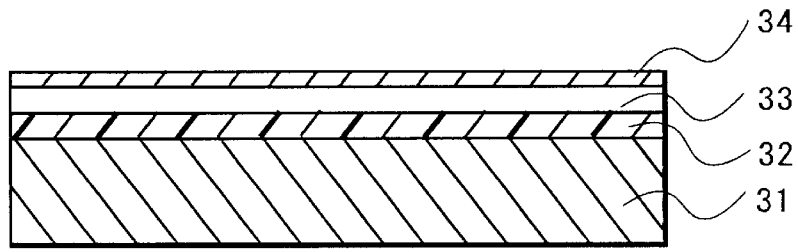
FIGS. 4A to 4C are views explaining the manufacturing method of a hybrid integrated circuit device of the invention.

The first process of the invention includes preparing a metal substrate, forming an insulating layer, pressure-laying a Cu foil and carrying out Ni plating, as show in FIG. 4A.

In the metal substrate preparing process, a substrate is prepared taking into consideration the properties of heat dissipation, substrate strength, substrate shield and so on. In this case, emphasis is placed particularly on heat dissipation property because heat concentration is caused by density increase where densely mounting integrating power transistors, large-scaled LSIs, digital signal processing circuits, etc. on one small-sized hybrid IC. The present embodiment explains the case using an Al substrate 31 having a thickness of, e.g. approximately 1.5 mm, that is excellent in heat dissipation property. Although this embodiment explains the case using an Al substrate as the substrate 31, there is no especial limitation.

For example, the present example can be realized by using, as the substrate 31, a print substrate, a ceramic substrate, a metal substrate or the like. It is possible to consider, as a metal substrate, a Cu substrate, an Fe—Ni substrate or a chemical substance of a metal excellent in conductivity.

Next, the aluminum substrate 31 is anodized to cause an oxide in its surface. Furthermore, a resin 32 excellent in insulation property, e.g. epoxy resin, is formed on the entire surface thereof. Note that the metal oxide may be omitted without problem where voltage resistance is not taken into consideration. Then, a Cu conductor foil 33 is pressure-laid on the insulating resin 32, to constitute a hybrid integrated circuit. On the Cu foil 33, Ni plating is provided over the entire surface in consideration of an adhesion to a metal fine wire 37 for electrical connection between the Cu foil 33 for turning into an lead-out electrode and the active element 35.

Figure 4B:
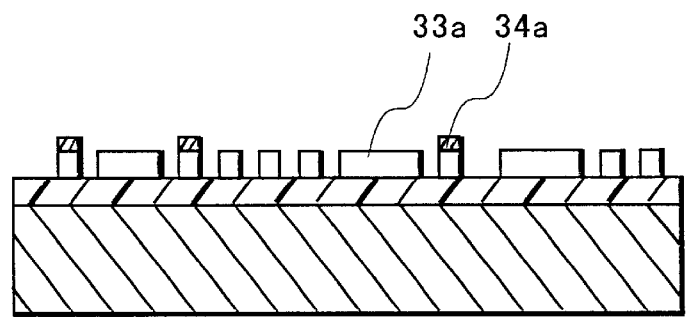

The second process of the invention includes forming partially Ni plating by etching and etching the Cu foil as shown in FIG. 4B.

On the Ni plating 34, resist is left only in an area requiring Ni plating 34 by known screen-printing or the like to form a selective mask. Then, Ni plating 34a is formed by etching, e.g. in an area for turning into an lead-out electrode, on the Cu foil 33. Thereafter, the resist is removed away. Again, resist is left only in an area requiring a Cu-foil conductor pattern 33a by known screen-printing or the like to form a selective mask. Then, a conductor pattern 33a is formed from Cu foil 33 on the insulating resin 32 by etching. Thereafter, a resin coat formed of an epoxy resin is applied on the conductor pattern 33a by screen-printing, for example. The resin coat is not applied on a region for electric connection.

Figure 4C:
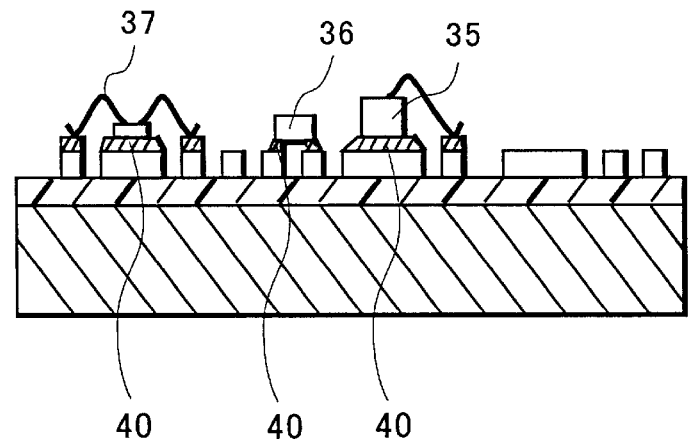

The third process of the invention includes carrying out die bonding and wire bonding, as shown in FIG. 4C.

On the conductor pattern 33a formed in the preceding process, an active element 35 such as a power transistor, a small-signal transistor or IC, and a passive element such as a chip resistor or a chip capacitor, are mounted through a conductive paste, such as a solder paste 40, thereby realizing a predetermined circuit. Herein, by providing electrical connection with an Ag paste or the like, solder may not be partly employed. Meanwhile, when mounting an active element 35, such as a power transistor or a semi-power transistor, a heat-sink is provided between the active element 35 and the conductive path 33a, in consideration of heat dissipation.

Next, in the case of mounting face up an active element 35, such as a semiconductor chip, electrical connection is made through a metal fine wire 37 by bonding. As noted above, the metal fine wire 37 for electrical connection between the active element 35 and the conductive path 33a is wire-bonded through the Ni plating 34, in consideration of an adhesion to the Cu-foiled conductive path 33a.

Herein, the metal fine wire 37 employs especially an Al fine wire 37. Because an Al wire 37 is difficult in forming a true-sphere ball, a stitch bonding scheme is employed. However, the stitch bonding is featured that a stitch point is readily broken by a resin stress and low in elastic modulus as compared to an Au wire thus readily fallen down under resin pressure. Accordingly, where using an Al wire 37, caution must be paid especially during forming a resin seal body 41.

Figure 5A:
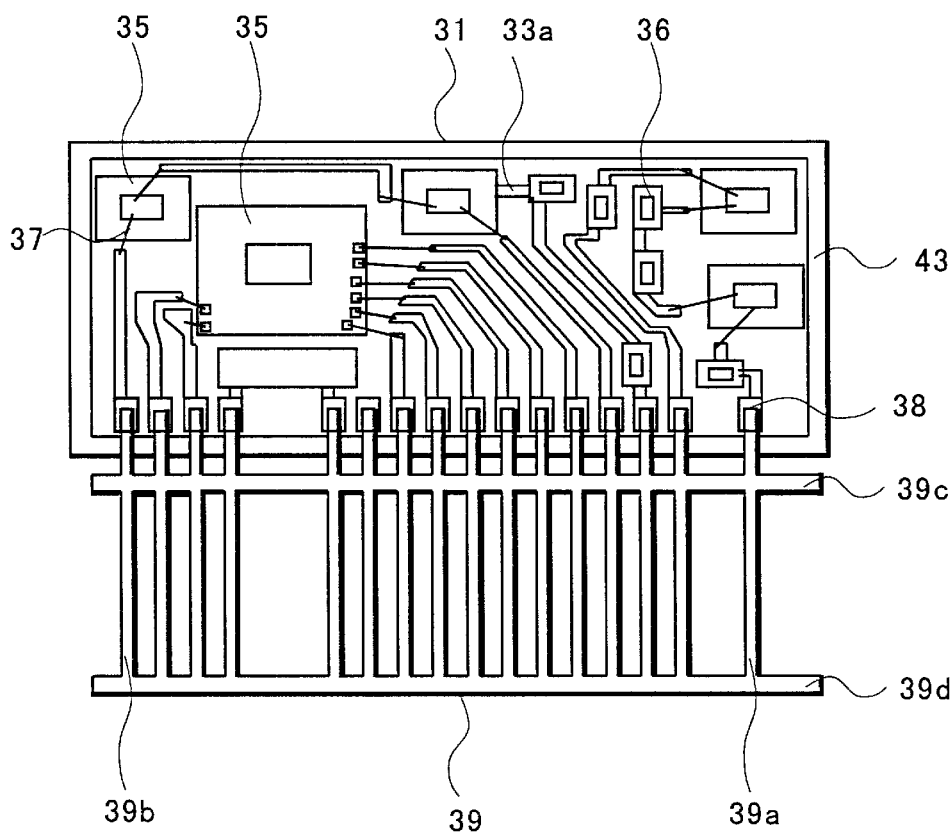
FIGS. 5A and 5B are views explaining the manufacturing method of a hybrid integrated circuit device of the invention.
Figure 5B:
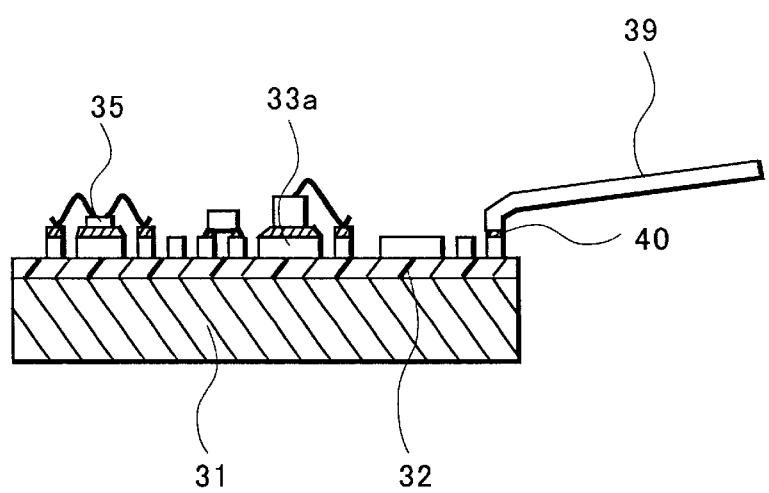

The fourth process of the invention includes carrying out connection with leads as shown in FIGS. 5A and 5B.

As shown in FIG. 5A, prepared is an outer lead 39 for outputting and inputting signals from and to the foregoing hybrid integrated circuit. The outer lead 39 is formed of a conductive material of Cu, Fe—Ni or the like for use as an output/input terminal. Furthermore, the width and thickness of the outer lead 39 is determined by taking into consideration a current capacity and the like. In the embodiment of the invention, the outer lead 39 requires strength and springiness although the detail will be explained in the next transfer mold process. Herein, prepared is an outer lead 39 of an Fe—Ne material having a thickness of approximately 0.4–0.5 mm, for example. Thereafter, the outer lead 39 is connected to an external connection terminal 38 formed in a peripheral region of the substrate 31 through a solder 40. At this time, the connection member is not necessarily limited to solder but connection can be possible by spot welding.

Herein, according to the invention, as shown in FIG. 5B, in that the outer lead 39 is connected somewhat obliquely relative to a mount surface of the substrate 31. For example, in FIG. 5B, connection is made at approximately 10° between a substrate back surface and a back surface of the outer lead 39. Also, the solder 40, for connection between the outer lead 39 and the external connection terminal 38, has a melting point higher than a cure temperature of a thermosetting resin to be used in the next transfer mold process.

The fifth process of the invention includes carrying out transfer molding as shown in FIGS. 6A to 7B. This process integrally covers the hybrid integrated circuit substrate with a thermosetting resin 49 by transfer molding.

Figure 6A:
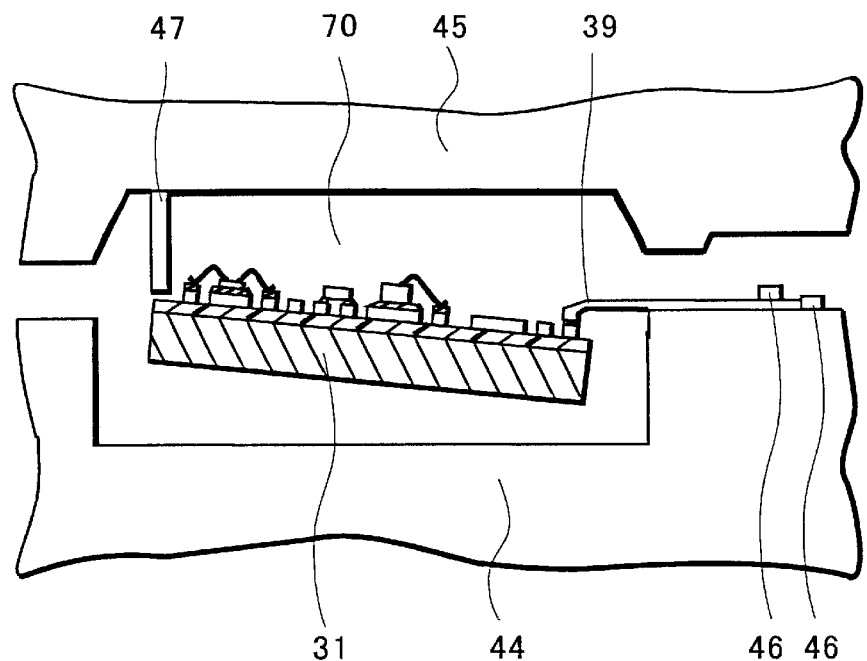
FIGS. 6A and 6B are views explaining the manufacturing method of a hybrid integrated circuit device of the invention.
Figure 6B:
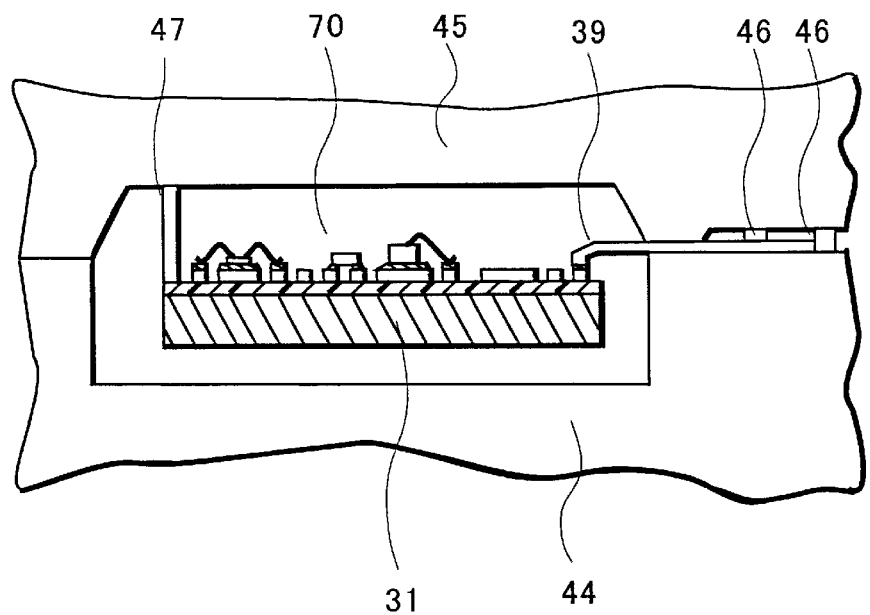

In order to integrally mold the hybrid integrated circuit substrates by transfer molding, the hybrid integrated circuit substrate 31 must be fixed in position within a mold cavity 70 as shown in FIG. 6B. However, because integrally resin-molding the hybrid integrated circuit substrate 31 including a back surface thereof, the hybrid integrated circuit substrate 31 must not be abutted directly against a lower mold die in the present invention. For this reason, the leadframe 39 is given with an angle as noted before. As shown in FIG. 6B, by a pushpin 47 the hybrid integrated circuit substrate 31 is structurally provided and fixed with a space in a back thereof. Similarly to this, adopted is a leadframe to be commonly used even where the number of pins differs.

Specifically, at first, the hybrid integrated circuit substrate 31 soldered with the leadframe 39 is transported to the mold dies 44 and 45, as shown in FIG. 6A.

Figure 7A:
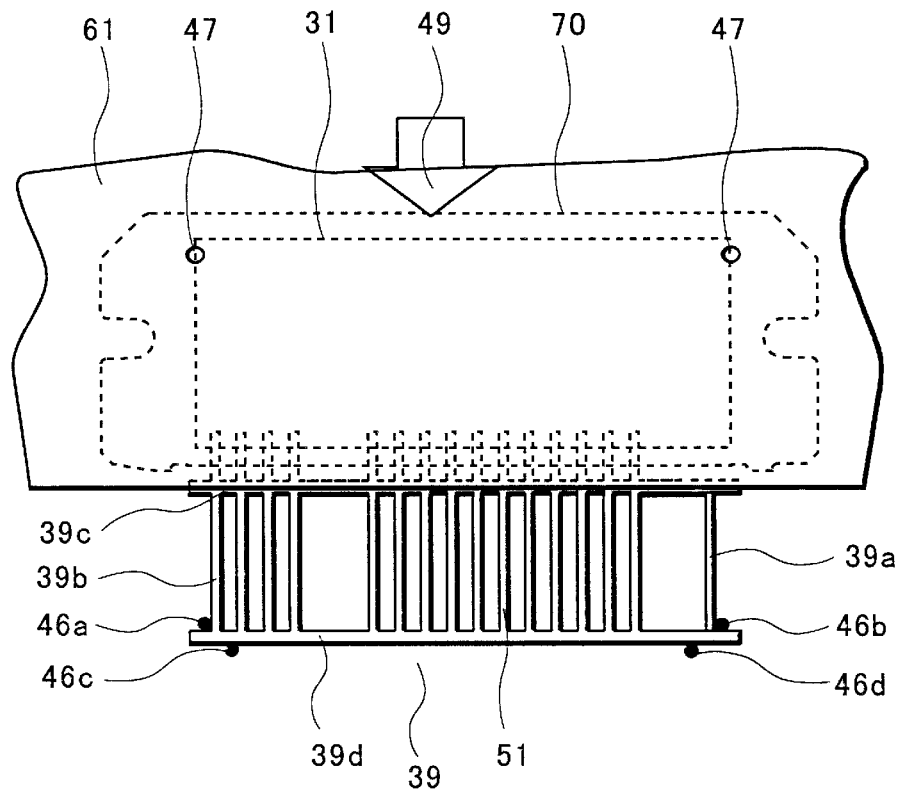
FIGS. 7A and 7B are views explaining the manufacturing method of a hybrid integrated circuit device of the invention.

Next, referring to FIG. 7A, the lead frame 39 at particular points are put into abutment against guide pins 46 thereby horizontally fixing the hybrid integrated circuit substrate 31 in position (herein in lengthwise and widthwise directions with respect to the page of FIG. 7A). Furthermore, referring to FIG. 6B, the pushpin 47 urges a peripheral point 43 of the hybrid integrated circuit substrate 31 thereby positionally fixing the hybrid integrated circuit substrate 31 in a thickness direction.

Specifically, the leadframe has a plurality of leads 39 each interconnected at two points of the first connection portion 39d and second connection portion 39c to be held as a frame. Meanwhile, the number of leads extended out of the hybrid integrated circuit substrate 31 is different depending upon the scale of an electric circuit to be formed on a surface of the hybrid integrated circuit substrate 31. Nevertheless, particular leads 39a and 39b for abutment against the guide pins 46 are necessarily provided in order to fix the leadframe 39 in its horizontal position. The spacing between those is constant based on a substrate size. Accordingly, in the case that the number of leads is changed by the scale of an electric circuit to be formed on the substrate surface, the number of the other leads than the leads for abutment against the guide pins 46 is increased and decreased. For this reason, the leadframe takes a structure that arbitrary points of leads are not present depending upon a scale of a circuit to be formed on the substrate surface.

Furthermore, as shown in FIG. 5B, the leadframe 39 is connected to the hybrid integrated circuit substrate 31 not in parallel therewith but having an upward inclination. This allows the hybrid integrated circuit substrate 31 to be positionally fixed in a thickness direction by the utilization of an elasticity of the leadframe 39, as will be hereinafter referred.

The guide pins 46 are projections provided on the lower mold die 44, as shown in FIGS. 6A, 6B and 7A. Referring to FIG. 7A, the guide pins 46 include the guide pins 46a and 46b for abutment against the connection points at between particular leads 39a and 39b and a first connection portion 39d, and the guide pins 46c and 46d for abutment at an outer side against the first connection portion 39d. Namely, by putting the four guide pins into abutment against particular points of the leadframe, the leadframe 39 can be positionally fixed in the horizontal direction. Consequently, the hybrid integrated circuit substrate 31 is also fixed in the horizontal direction.

Furthermore, where transfer-molding a hybrid integrated circuit substrate different in output/input terminal count, the mold dies and guide pins 46 can be commonly used because the particular leads 39a and 39b are spaced constant to eliminate the leads between them.

As shown in FIGS. 6A and 6B, pushpins 47 are provided on the upper mold die 45, wherein the leadframe 39 is soldered, with an upward inclination, to the hybrid integrated circuit substrate 31. Consequently, in case the upper mold die 45 and the lower mold die 44 are fitted together as shown in FIG. 6B, the hybrid integrated circuit substrate 31 is urged down by the pushpins 47 into a position parallel with a bottom surface of the lower mold die 44. This fixes the position of the hybrid integrated circuit substrate in a thickness direction within the mold cavity 70.

Figure 7B:
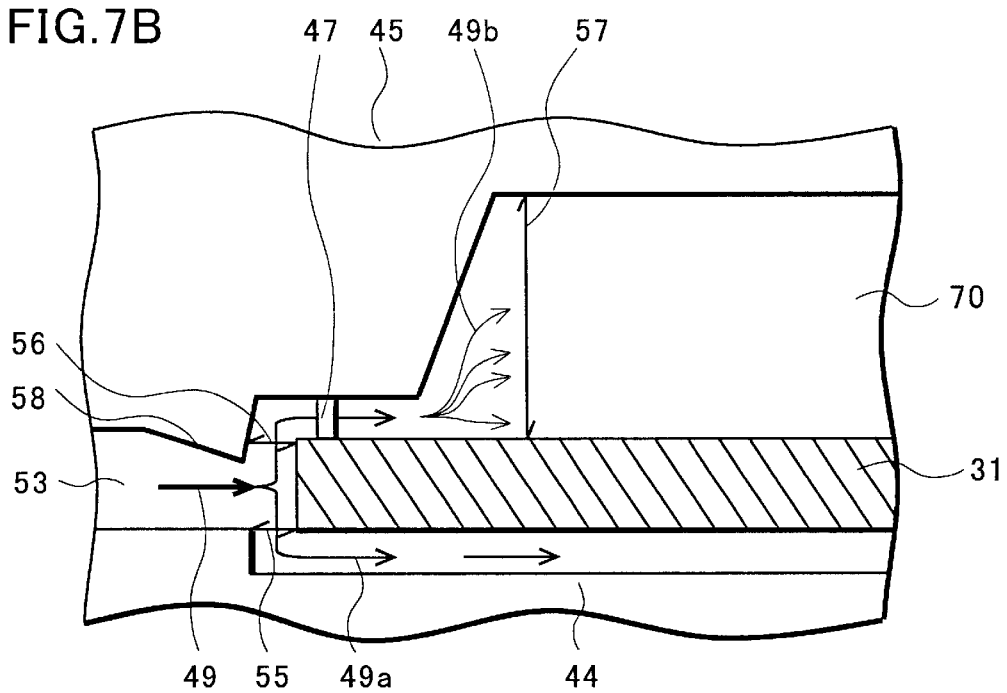

Then, as shown in FIG. 7B, thermosetting resin is injected through a gate 49 into the mold cavity 70 such that it first hits a side surface of the substrate 31. The thermosetting resin injected as shown at an arrow 49 is caused to flow branching toward the above and the below of the substrate 31, as shown at an arrow 49a. At this time, because the flow width 56 toward the above of the substrate 31 is provided nearly equal to the flow width 55 toward the below of the substrate 31, the thermosetting resin is allowed to smoothly flow toward the below of the substrate 31. Particularly, because resin is first filled at the backside of the hybrid integrated circuit substrate 31, there is no possibility for the hybrid integrated circuit substrate to incline downward. Furthermore, the thermosetting resin is reduced in its injection velocity and pressure by being hit on the side surface of the substrate 31. Thus, it is possible to prevent against the effect of bending or breakage of the Al fine wires 37.

From the above, the present process can carry out integrally transfer mold after positionally fixing the hybrid integrated circuit substrate 31 within the mold cavity 70. There is no movement of the hybrid integrated circuit substrate 31 under an injection pressure of thermosetting resin 49. Accordingly, with the thermosetting resin having high heat conductivity, the hybrid integrated circuit substrate 31 can be molded at its back surface to a constant thickness. It is thus possible to manufacture a hybrid integrated circuit device excellent in voltage resistance and heat dissipation property.

Furthermore, the solder 40, connecting the active element 35 such as a power transistor, small-signal transistor or IC, the passive element 36 such as a chip resistance or chip capacitance, and the outer lead 39, has a melting point higher than a melting point of the thermosetting resin. Thus, there is no occurrence of re-melting and deviation in fixing position due to the heat of upon transfer molding without protection with a potted resin 9 (see FIG. 9) required in the conventional hybrid integrated circuit device.

Incidentally, the second connection portion 39c of the leadframe serves to prevent the thermosetting resin from flowing to the outside of the mold during transfer molding. Consequently, immediately after transfer molding is completed, the resin molded has a continuing region to the second connection portion 39c.

Figure 8:
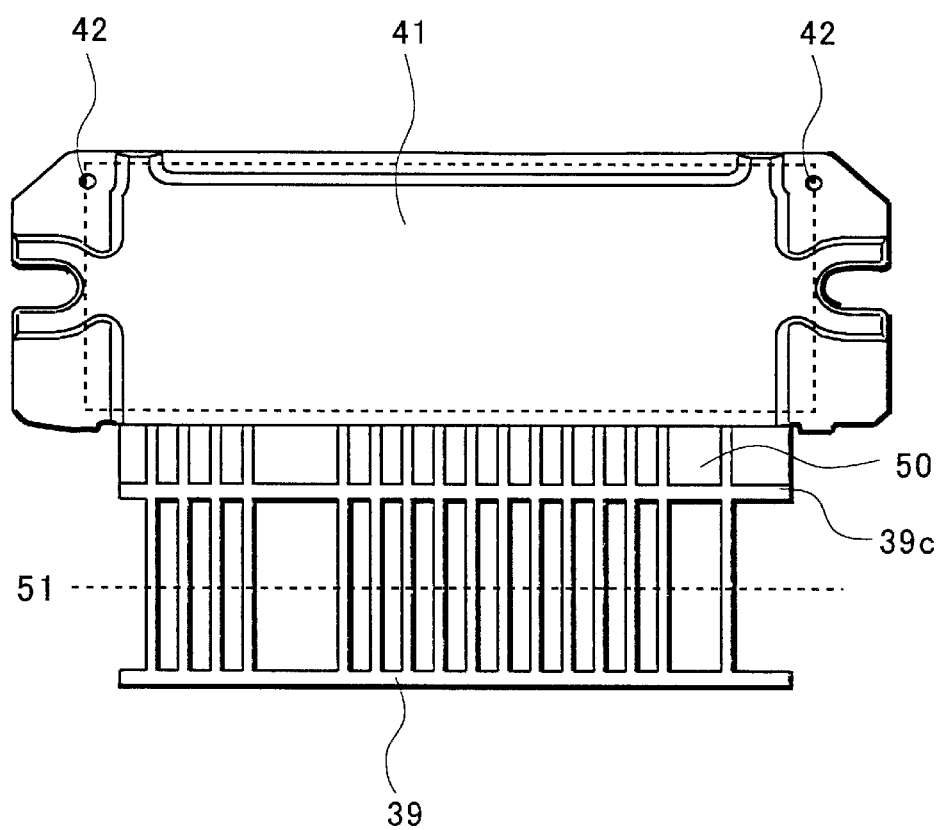
FIG. 8 is a view explaining the manufacturing method of a hybrid integrated circuit device of the invention.

The sixth process of the invention includes cutting the leads as shown in FIG. 8.

The resin, leaked through a thickness of the outer lead from the mold dies 44, 45 during the preceding transfer mold process, is dammed by the second connection portion 39c formed on the outer lead 39, and then cured as it is. Namely, leaked resin 50 fills between the leads of the outer lead 39 in an area closer to the resin seal body 41 than the second connection portion 39c. However, in the structure, no resin flows to between the leads of the outer lead 39 in an area closer to a tip than the second connection portion.

By punching away the second connection portion 39c, the leaked resin 50 is simultaneously removed. By adjusting the length of the outer lead 39 in accordance with a use purpose, e.g. by cutting the outer lead 39 at a dotted-lined position 51, individual leads are made independent for use as input/output terminals.

By the above process, a hybrid integrated circuit device shown in FIG. 1 is completed.

As described above, according to the manufacturing method of a hybrid integrated circuit device of the invention, a particular lead is put into abutment against a guide pin provided on a mold die in a transfer mold process thereby carrying out positional fixing of a hybrid integrated circuit device within the mold. Due to this, the manufacturing method of hybrid integrated circuit device of the invention can omit the placement of a support member required in the conventional manufacturing method of a hybrid integrated circuit device. Furthermore, it is possible to greatly improve the heat dissipation property of a completed hybrid integrated circuit device.

The hybrid integrated circuit device of the invention and manufacturing method thereof, although explained on the full-mold type hybrid integrated circuit device, is not limited to the foregoing embodiment. For example, it is possible to form a hybrid integrated circuit device having a form entirely exposed in the back surface of a hybrid integrated circuit substrate. In this case, besides the effect noted above, an effect of heat dissipation property can be obtained.

Furthermore, the present embodiment, although explained on the case with one-sided lead having outer leads extending at one surface of the substrate, is not limited to this structure. With both-sided leads or four-way leads, besides the above effect, furthermore a transfer mold process can be realized in a state the substrate is stabilized. Besides, various modifications are possible within a range not departing from the gist of the invention.

Furthermore, where the lead 39a is not used as a terminal for electric signals, as shown in FIG. 7A, the leads directed from the second connection portion 39c toward the substrate 31 may be removed.

As explained above, the manufacturing method of a hybrid integrated circuit device of the invention provides the following excellent effects.

By placing a point connecting between a particular lead and a connection portion into abutment against a guide pin provided on a mold die in a molding process, a hybrid integrated circuit substrate connected to the leadframe can be positionally fixed within a mold cavity and then integrally transfer-molded with a thermosetting resin. Due to this, the hybrid integrated circuit substrate can be molded, at its back surface, in a constant thickness with the use of a thermosetting resin excellent in heat conductivity, whereby a hybrid integrated circuit device can be fabricated that is excellent in heat dissipation property. Also, by providing a spacing of the leads for abutment against guide pins irrespectively of the number of terminals of the hybrid integrated circuit substrate, the mold die can be commonly used where transfer-molding a hybrid integrated circuit substrate different in terminal count.

Meanwhile, by providing a connection portion to a region the leadframe is to be abutted against the upper and lower mold dies, it is possible to prevent a thermosetting resin from leaking through a gap between the leads to the outside of the mold during the molding process. Also, by making the connection portion length constant irrespectively of the terminal count on the hybrid integrated circuit substrate, the mold can be commonly used where transfer-molding a hybrid integrated circuit substrate different in terminal count.

What is claimed is:

1. A method of manufacturing a hybrid integrated circuit device comprising the steps of:

preparing a hybrid integrated circuit substrate having circuit elements electrically connected through conductor patterns;

fixing a conductor member extended as an input or output to an outside onto desired conductors pattern by a solder;

fixing the position of the hybrid integrated circuit substrate by clamping and fixing the conductor member by upper and lower mold dies; and integrally molding the hybrid integrated circuit substrate by transfer molding using a thermosetting resin.

2. The method of manufacturing a hybrid integrated circuit device according to claim 1, wherein the conductor member is a plurality of leads.

3. The method of manufacturing a hybrid integrated circuit device according to claim 2, wherein each of the plurality of leads is connected each other at least two connection portions, the leads being held as one leadframe until completing the step of molding.

4. The method of manufacturing a hybrid integrated circuit device according to claim 3, wherein the leadframe has a first connection portion at an extension outer end of the lead, and a second connection portion in a portion to be abutted against the upper and lower mold dies during molding.

5. The method of manufacturing a hybrid integrated circuit device according to claim 3, wherein, in the step of molding, the leadframe is abutted at lengthwise and widthwise sides against guide pins provided on the mold die to thereby fix the position of the hybrid integrated circuit substrate.

6. The method of manufacturing a hybrid integrated circuit device according to claim 4, wherein the second connection portion is to be removed away after completing the step of molding.

7. The method of manufacturing a hybrid integrated circuit device according to claim 5, wherein a spacing between the leads of the leadframe to be abutted against the guide pins is constant regardless of the number of leads extended from the hybrid integrated circuit substrate.

8. The method of manufacturing a hybrid integrated circuit device according to claim 4, wherein, in the step of molding, the second connection portion is abutted against the upper and lower dies to thereby prevent thermosetting resin from leaking to an outside.

9. The method of manufacturing a hybrid integrated circuit device according to claim 3, wherein the leadframe extends from opposite two sides of the hybrid integrated circuit substrate.

* * * * *